(12) United States Patent
Nishimuta et al.

(10) Patent No.: US 8,314,449 B2
(45) Date of Patent: Nov. 20, 2012

(54) MIS TRANSISTOR AND CMOS TRANSISTOR

(75) Inventors: Takefumi Nishimuta, Aichi-ken (JP); Hiroshi Miyagi, Niigata (JP); Tadahiro Ohmi, Miyagi (JP); Shigetoshi Sugawa, Miyagi (JP); Akinobu Teramoto, Miyagi (JP)

(73) Assignee: Foundation For Advancement Of International Science, Tsukuba, Ibaraki Prefecture (JP)

( * ) Notice: Subject to any disclaimer, the term of this patent is extended or adjusted under 35 U.S.C. 154(b) by 0 days.

(21) Appl. No.: 12/604,015

(22) Filed: Oct. 22, 2009

(65) Prior Publication Data

US 2010/0038722 A1 Feb. 18, 2010

Related U.S. Application Data

(62) Division of application No. 10/560,706, filed as application No. PCT/JP2004/008218 on Jun. 11, 2004, now abandoned.

(30) Foreign Application Priority Data

Jun. 13, 2003 (JP) ................ 2003-170118

(51) Int. Cl.
*H01L 21/76* (2006.01)
(52) U.S. Cl. ...................... 257/288; 257/619
(58) Field of Classification Search .......... 257/288, 257/619, E29.264
See application file for complete search history.

(56) References Cited

U.S. PATENT DOCUMENTS

| | | |
|---|---|---|
| 5,391,506 A | 2/1995 | Tada et al. |
| 5,932,911 A | 8/1999 | Yue et al. |
| 6,245,615 B1 | 6/2001 | Noble et al. |
| 6,555,451 B1 | 4/2003 | Kub et al. |
| 6,974,729 B2 * | 12/2005 | Collaert et al. ............... 438/157 |
| 7,202,534 B2 | 4/2007 | Ohmi et al. |
| 2002/0123197 A1 | 9/2002 | Fitzgerald et al. |
| 2002/0185676 A1 | 12/2002 | Momose |

(Continued)

FOREIGN PATENT DOCUMENTS

CN 1500291 A 5/2004

(Continued)

OTHER PUBLICATIONS

Partial English translation of office action for corresponding Taiwanese Patent Application and Taiwanese Office Action.
Hisamoto et al, "FinFET—A Self-Aligned Double-Gate MOSFET Scalable to 20nm", *IEEE Transactions on Electron Devices*, vol. 47, No. 12, pp. 2320-2325, Dec. 12, 2000.
Y. Choi et al, "FinFET Process Refinements for Improved Mobility and Gate Work Function Engineering", *Electron Devices Meeting, IEDM 02 Digest*, pp. 259-262, Dec. 2002.

(Continued)

*Primary Examiner* — Bradley K Smith
(74) *Attorney, Agent, or Firm* — Locke Lord LLP

(57) ABSTRACT

A MIS transistor, formed on a semiconductor substrate, assumed to comprise a semiconductor substrate (702, 910) comprising a projecting part (704, 910B) with at least two different crystal planes on the surface on a principal plane, a gate insulator (708, 920B) for covering at least a part of each of said at least two different crystal planes constituting the surface of the projecting part, a gate electrode (706, 930B), comprised on each of said at least two different crystal planes constituting the surface of the projecting part, which sandwiches the gate insulator with the said at least two different planes, and a single conductivity type diffusion region (710*a*, 710*b*, 910*c*, 910*d*) formed in the projecting part facing each of said at least two different crystal planes and individually formed on both sides of the gate electrode. Such a configuration allows control over increase in the element area and increase of channel width.

1 Claim, 12 Drawing Sheets

U.S. PATENT DOCUMENTS

| | | |
|---|---|---|
| 2003/0049895 A1 | 3/2003 | Cerofolini et al. |
| 2003/0102497 A1* | 6/2003 | Fried et al. .................. 257/255 |
| 2004/0102052 A1 | 5/2004 | Ohmi et al. |

FOREIGN PATENT DOCUMENTS

| | | |
|---|---|---|
| EP | 0 261 666 A1 | 3/1988 |
| EP | 1 455 393 A1 | 9/2004 |
| EP | 1 633 000 A1 | 3/2006 |
| EP | 1 633 001 A1 | 3/2006 |
| FR | 2 720 191 A1 | 11/1995 |
| JP | 63-228662 A | 9/1988 |
| JP | 1-276669 A | 11/1989 |
| JP | 5-136382 A | 6/1993 |
| JP | 3-155165 A | 7/1993 |
| JP | 7-249768 A | 9/1995 |
| JP | 8-264764 A | 10/1996 |
| JP | 9-023011 A | 1/1997 |
| JP | 9-23011 A | 1/1997 |
| JP | 2002-110963 A | 4/2002 |
| JP | 2002-261091 A | 9/2002 |
| JP | 2002-359293 A | 12/2002 |
| WO | 03/054962 A1 | 7/2003 |

OTHER PUBLICATIONS

Y. Choi et al, "Nanoscale CMOS Spacer FinFET for the Terabit Era", *IEEE Electron Device Letters*, vol. 23, No. 1, pp. 25-27, Jan. 2002.

Taiwanese Office Action, dated Dec. 29, 2005, issued in counterpart application.

Taiwanese Office Action, dated Apr. 21, 2008, received in corresponding Taiwanese Patent Application No. 09720202710 with English translation.

Chinese Office Action, dated Jul. 18, 2008, received in corresponding Chinese Patent Application No. 200480016271.0 with English translation.

Japanese Office Action for Application No. 2003-170118, issued Oct. 27, 2009.

Japanese Office Action for Application No. 2003-170118, issued Aug. 17, 2010.

Corner Enhanced Field-Effect Transistor, *IBM Technical Disclosure Bulletin*, vol. 34, No. 12, May 1992, pp. 101-102.

Supplementary European Search Report for Application No. 04745812.0-1528, dated Aug. 19, 2010.

\* cited by examiner

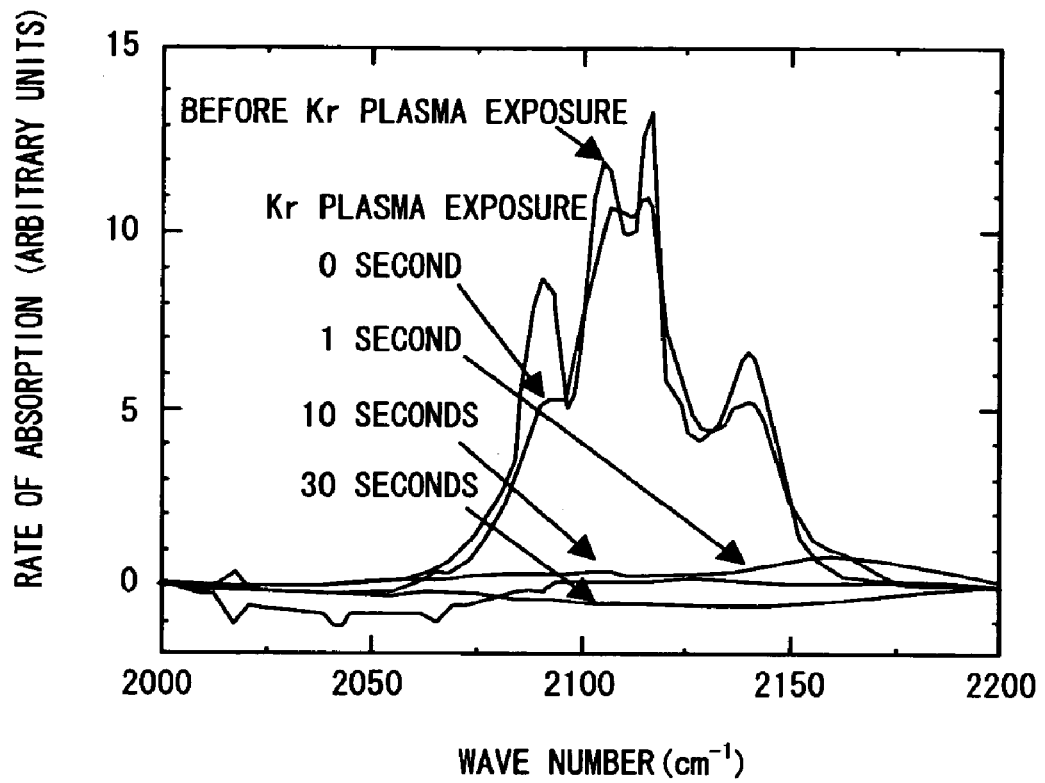
F I G. 2

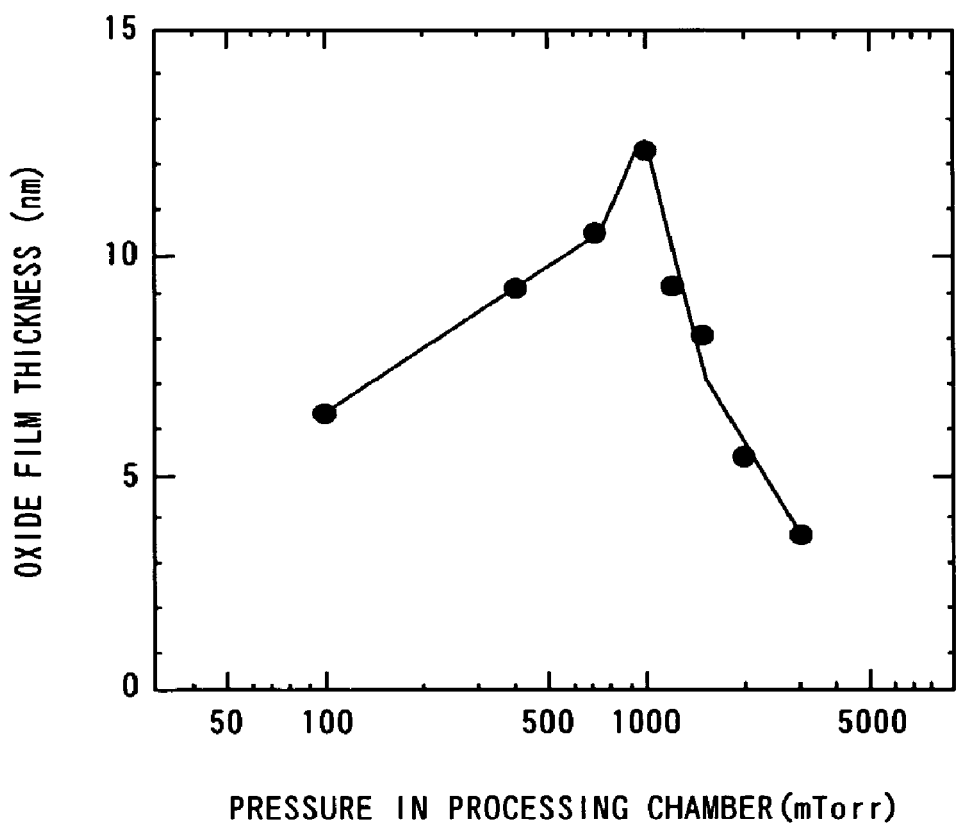
F I G. 3

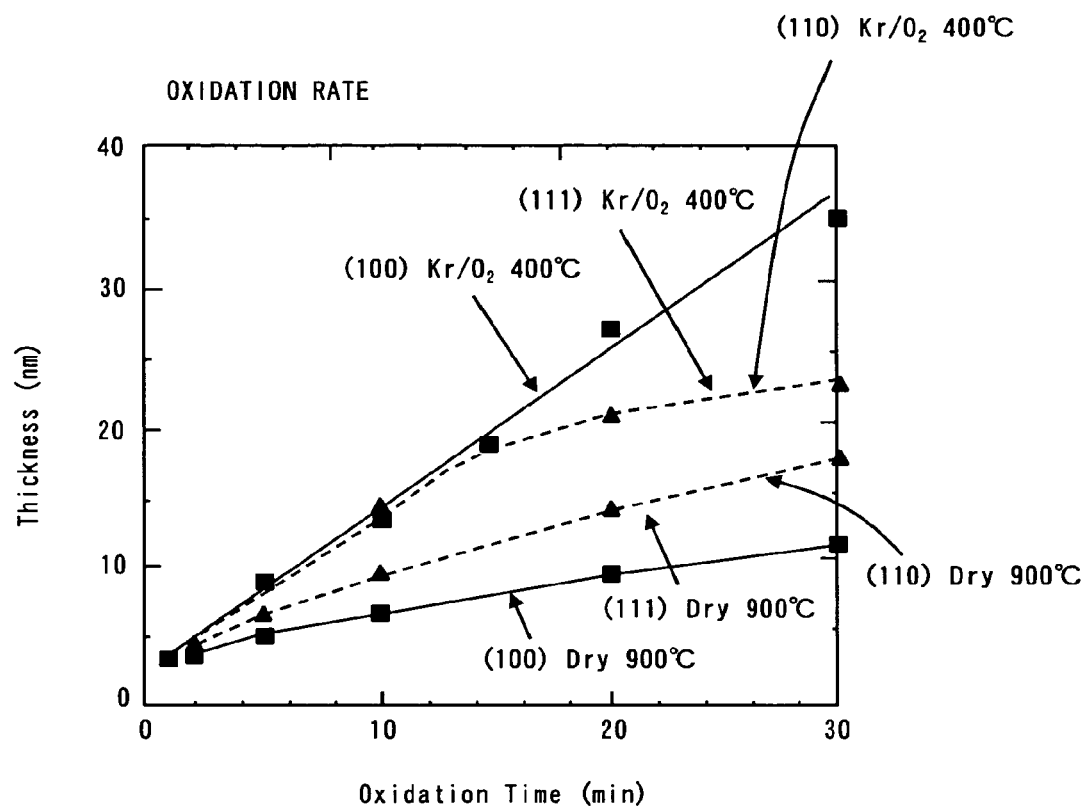
F I G. 4

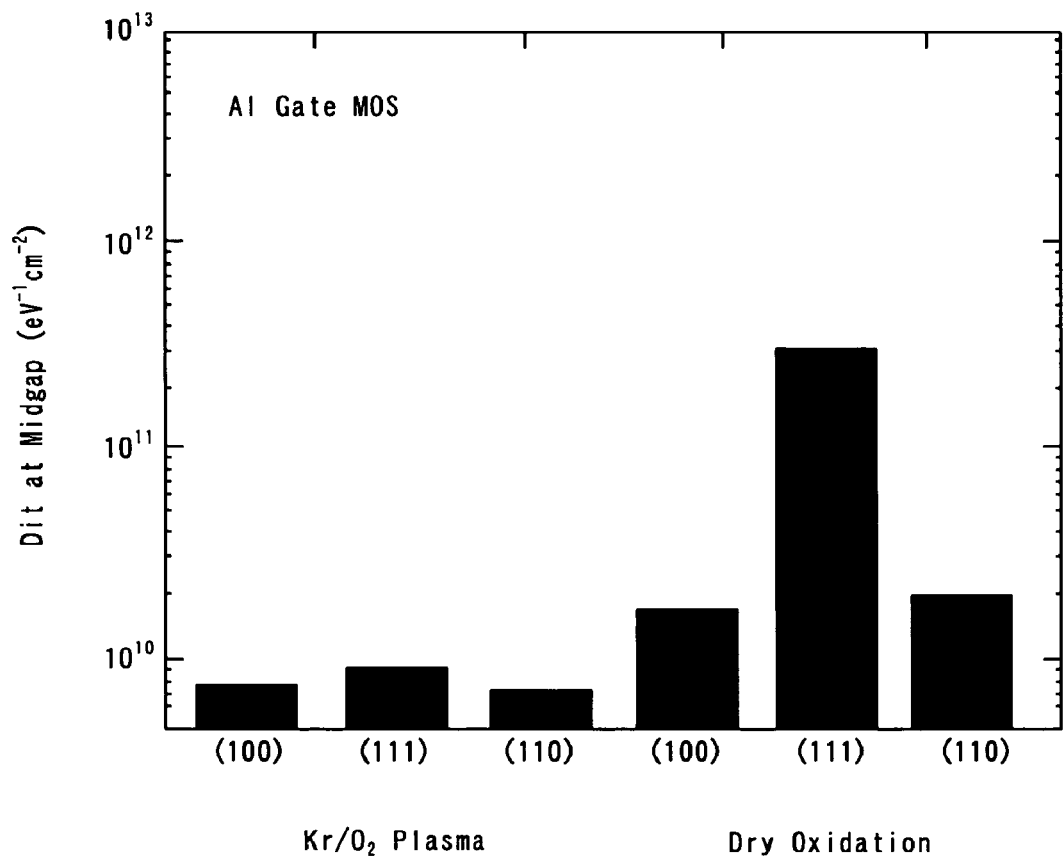
F I G. 5

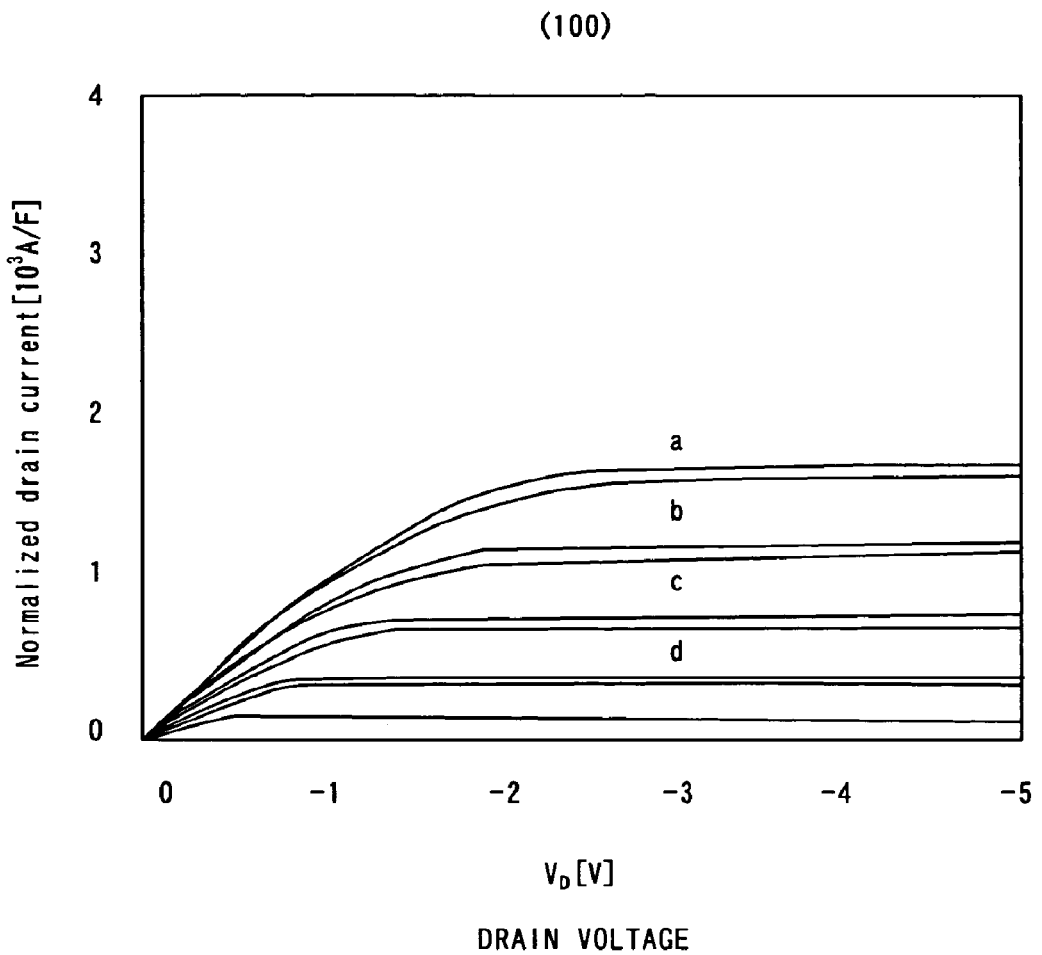
F I G. 1 0 A

MIS TRANSISTOR AND CMOS TRANSISTOR

This application is a divisional of prior application Ser. No. 10/560,706, filed on Jul. 24, 2006, which claims the benefit of International Application Number PCT/JP2004/008218, filed on Jun. 11, 2004, under 35 USC §371, entitled, "MIS Transistor and CMOS Transistor" which claims the benefit of Japanese Patent Application Number JP 2003-170118, filed on Jun. 13, 2003, all of which are hereby incorporated by reference.

FIELD OF THE INVENTION

The present invention relates to a technology to adjust the gate width of an MIS (Metal Insulator Semiconductor) transistor.

BACKGROUND OF THE INVENTION

The MIS (Metal Insulator Semiconductor) transistor is known as a semiconductor device from the past.

There are various fabrication methods of a gate insulator comprised in a MIS transistor, and one example is the technique of thermal oxidation, which is thermal oxidation treatment at approximately 800° C. or above using oxygen molecules and water molecules.

According to such a thermal oxidation technique, as a preprocess of the thermal oxidation process forming the gate insulator, processing to remove surface attached contaminants such as organic matter, metals and particles, followed by cleaning using diluted hydrofluoric acid and hydrogenated water, silicon dangling bonds on the surface of the silicon substrate (there are other semiconductor substrates such as germanium) on which the gate insulator is to be formed, are terminated by hydrogen, controlling formation of a native oxide film on the surface of the silicon substrate, and the silicon substrate with a clean surface is introduced to the following thermal oxidation process.

In this thermal oxidation process, heating of the silicon substrate is performed in an inert gas atmosphere such as argon (Ar). In this process of heating, surface-terminating hydrogen, which terminates the silicon dangling bonds on the surface of the silicon substrate, is removed with at a temperature of about 600° C. or higher, and oxidation of the surface of the silicon substrate is performed at a temperature of about 800° C. or higher in an atmosphere where oxygen molecules or water molecules are introduced.

When a silicon oxide film is formed on the surface of a silicon substrate using such a thermal oxidation technique, in the case of a silicon substrate with its surface being the crystal plane of the (100) plane orientation, oxide film/silicon interface characteristics, pressure-resistant characteristics of the oxide film, leakage current characteristics etc. are favorable. Other techniques alternative to the above thermal oxidation technique should yield the equivalent effect as well.

Then, in configuring an MIS transistor on a silicon substrate, a gate insulator is formed on the surface (the (100) plane) of a silicon substrate with the (100) plane being the principal plane, based on a technique such as the above thermal oxidation technique, and the insulator is comprised in a transistor (the p-channel MIS transistor and the n-channel MIS transistor) with a MIS configuration.

In addition, by forming an oxide film on a gate insulator using a technique such as the above thermal oxidation technique, a complementary MOS transistor (hereinafter referred to as a CMOS transistor) comprising a p-channel MOS (Metal Oxide Semiconductor) transistor and a n-channel MOS transistor can be integrated on the (100) plane of a silicon substrate.

On the other hand, semiconductor devices with a MOS transistor of distinctive gate configuration have appeared increasingly.

One example of those devices is a single conductivity type (the p-channel or the n-channel) MOS transistor configured by forming a gate insulator by applying the above thermal oxidation processing to one crystal plane (the (100) plane) of a projecting part formed on a semiconductor substrate and by forming channels on a sidewall plane of the projecting part of the semiconductor substrate (Japanese laid-open unexamined patent publication No. 2002-110963).

In general, when gate voltage is applied to an MIS transistor configured by forming the gate insulator on one crystal plane (the (100) plane), channels are formed in the silicon substrate. At that time, the channel width is provided by a length in a direction perpendicular to the direction of electron or hole movement along the channels formed along the one crystal plane.

In order to enhance the current driving capacity of the above MIS transistor, the electron transfer or hole transfer of the above channels are required to be enhanced, in order to realize the above, a design such that the above channel width should be lengthened, and such as to reduce waste of electrons and holes within the channel is required.

Patent Document 1: Japanese laid-open unexamined patent publication No. 2002-110963

However, in a general configuration of an MIS transistor, it is difficult to enhance the integrity of elements on a semiconductor because the element area of the MIS transistor increases as the channel width increases. In the case of adopting the technique disclosed in the Japanese laid-open unexamined patent publication No. 2002-110963, surplus electrons and holes are wasted depending on the plane orientation indicated by the semiconductor substrate projecting part on which channels are formed, and even if the energy amount, which is effective for driving a transistor, used for each unit length of the channel width is optimal in the (100) crystal plane, for example, it would be dramatically reduced in the other crystal planes.

When configuring a CMOS transistor, electron mobility has a value two or three times larger than hole mobility, and therefore, in order to match the current driving capacities to each other, the element area of a p-channel MOS transistor with small current driving capacity has to be made larger than that of an n-channel MOS transistor so that the channel width of the p-channel MOS transistor becomes large. Conversely, in the attempt to match the element areas, the channel widths become the same and thus the current driving capacities do not match.

DETAILED DESCRIPTION OF THE PREFERRED EMBODIMENTS

It is an object of the present invention to provide a MIS transistor for allowing an increase in the channel width at the same time as control of an increase in element area, and for allowing control of reduction of the amount of energy, which is effective for driving a transistor, for each unit length of the channel width in the channel, and another object of the present invention is to provide a CMOS transistor in which the element areas of a p-channel MOS transistor and the n-channel MOS transistor are the same, and the current driving capacities also match. The MIS transistor has the following configuration.

One mode of the MIS transistor of the present invention is a MIS transistor, formed on a semiconductor substrate, comprising a semiconductor substrate with a projecting part of which the surfaces are at least two different crystal planes on a principal plane, a gate insulator for covering at least a part of each of said at least two different crystal planes constituting the surface of the projecting part, a gate electrode comprised by the gate insulator so as to be electrically insulated from the semiconductor substrate, and comprised on each of said at least two different crystal planes constituting the surface of the projecting part and a single conductivity type diffusion region (n-type or p-type conductivity type for example, and the single conductivity type diffusion means that the regions, formed both sides of the above gate electrode, have diffusion regions of the same conductivity type) formed in the projecting part facing each of said at least two different crystal planes constituting the surface of the projecting part and individually formed on both sides of the gate electrode.

In so doing, it is desirable that the channel width of a channel formed along with the gate insulator between the single conductivity diffusion regions individually formed on both sides of the gate electrodes is indicated by summation of the channel widths of each channel generated along said at least two different crystal planes.

It is also desirable that the above gate insulator covers at least a part of each of said at least two different crystal planes, which configure the surface of the projecting part, so that said at least two different crystal planes are continuously covered.

Another mode of the MIS transistor of the present invention is a MIS transistor formed on a semiconductor substrate, comprising a semiconductor substrate with a projecting part of which the surfaces are at least two different crystal planes on a principal plane, a gate insulator for covering at least a part of each of said at least two different crystal planes constituting the principal plane and the surface of the projecting part, a gate electrode comprised by the gate insulator so as to be electrically insulated from the semiconductor substrate, and comprised on each of said at least two different crystal planes constituting the principal plane and the surface of the projecting part and a single conductivity type diffusion region formed in the projecting part facing each of said at least two different crystal planes constituting the principal plane and surface of the projecting part and individually formed on both sides of the gate electrodes.

In so doing, the channel width of the channel generated along the principal plane may be complemented with the channel width of the channel generated along a crystal plane, different from the principal plane, of said at least two crystal planes.

It is desirable that the above gate insulator covers at least a part of each of said at least two different crystal planes, which configure the principal plane and the surface of the projecting part, so that the principal plane and said at least two different crystal planes are continuously covered.

It is also desirable that each of the above modes of the MIS transistor comprises a signal transistor.

It is again desirable that each of the above modes of the MIS transistor has a configuration characterized in that the semiconductor substrate is a silicon substrate and the principal plane and said at least two different crystal planes are any two different crystal planes from the (100) plane, the (110) plane and the (111) plane.

With such a configuration, the channel generated along the gate insulator of the MIS transistor is generated along said at least two different crystal planes. In a MIS transistor with such a configuration, the channel width can be acquired in a direction different from a crystal plane, which directly enlarges the element area. It is possible to control the reduction of the amount of energy which is effective for driving a transistor, for each unit length of channel width in the channel generated along the gate insulator.

In addition, it is desirable that in each of the above modes of the MIS transistor, the gate insulator is formed by exposing the surface of the silicon substrate to plasma of a prescribed inert gas so as to remove the hydrogen, and that the hydrogen content at an interface of the silicon substrate and the gate insulator is $10^{11}/cm^2$ or less in units of surface density.

Such a configuration allows the control of reduction in the energy amount which is effective for driving a transistor, for each unit length of the channel width in the channel generated along the gate insulator.

Furthermore, by the generation of the channel along with the projecting part, it is possible to control the channel length modulation effect, which is reduction of the effective gate length and an increase in the drain current, caused by the shift of a pinch-off point (a point where the channel carrier density becomes approximately 0) in the saturation region in the transistor characteristics.

One mode of the CMOS transistor of the present invention supposes that an n-channel MOS transistor is formed only on the principal plane of the semiconductor substrate, and in the above each mode of the MIS transistor, and in the above each mode of MIS transistors, a p-channel MOS transistor comprises the gate insulator as an oxide film and the single conductivity type diffusion region as a p-type diffusion region.

Another mode of the CMOS transistor of the present invention supposes that an n-channel MOS transistor and a p-channel MOS transistor be comprised on a silicon substrate with the (100) plane as its principal plane, and the n-channel MOS transistor comprises a gate oxide film covering a part of the principal plane alone, a gate electrode configured on the principal plane by the gate oxide film so as to be electrically insulated from the silicon substrate, and an n-type diffusion region formed in the silicon substrate facing the principal plane and formed on both sides of the gate electrode, and the p-channel MOS transistor comprises a p-type diffusion region equivalent to the single conductivity type diffusion region in each mode of the MIS transistor described above, a gate oxide film equivalent to the gate insulator in each mode of the MIS transistor described above, and the (100) crystal plane and a second crystal plane is the (110) crystal plane corresponding to said at least two crystal planes in each mode of the MIS transistor described above.

It is desirable to configure each mode of the above CMOS transistor so that both the current driving capacities of the p-channel MOS transistor and the n-channel MOS transistor are equal to each other and the element areas of the p-channel MOS transistor and the n-channel MOS transistor are the same.

With such a configuration, in a p-channel MOS transistor, which is a direct cause of the large element area of the CMOS transistor, a gate insulator can be formed on a crystal plane oriented in a different direction from a crystal plane, which directly causes the element area of the CMOS transistor to be large. For that reason, in the p-channel MOS transistor, the channel width of a channel generated along the gate insulator can be generated in a different direction from a direction, which directly causes the element area to be large. Then, the current driving capacity of the p-channel MOS transistor and the current driving capacity of the n-channel MOS transistor can be matched without variation in element area between the MOS transistors.

Because the channel width can be acquired along said at least two different crystal planes in the p-channel MOS transistor, it is possible that the element area and the current driving capacity of the p-channel MOS transistor and the n-channel MOS transistor, which is formed only on the principal plane, can be approximately matched.

BRIEF DESCRIPTION OF THE DRAWINGS

The present invention will be more apparent from the following detailed description in conjunction with the accompanying drawings, in which:

FIG. 2 is an analysis result of silicon-hydrogen bonding on the surface of a silicon substrate 103 in FIG. 1 by an infrared spectrograph;

FIG. 3 is a relationship between pressure in a processing chamber and thickness of an oxide film formed when the gas pressure in the processing chamber 101 of FIG. 1 is changed while keeping the pressure ratio of $Kr/O_2$ at 97/3 in the processing chamber;

FIG. 4 is a diagram comparing growth rates of $Kr/O_2$ plasma oxide films with growth rates of dry thermal oxide films;

FIG. 5 is a diagram comparing Dit at midgap of the $Kr/O_2$ plasma oxide film with that of the dry thermal oxide film;

FIG. 10A shows drain voltage versus normalized drain current characteristic;

DETAILED DESCRIPTION OF THE PREFERRED EMBODIMENT

In the following description, details of a preferred embodiment of the present invention are set forth with reference to the accompanying drawings.

A transistor of the embodiment of the present invention has an MIS (Metal Insulator Semiconductor) configuration.

A gate insulator of the MIS transistor is formed based on a gate insulator thin film formation technique, in which a thin gate insulator of an MIS transistor is formed with high performance electrical characteristics, as disclosed in Japanese laid-open unexamined patent publication No. 2002-261091.

An explanation of the gate insulator thin film formation technique of the MIS transistor is provided first.

Regarding the type of gate insulator of the MIS transistor there are a variety such as an oxide film, a nitride film and an oxynitride film described in Japanese laid-open unexamined patent publication No. 2002-261091, and also many varieties for semiconductor substrates with different crystal planes such as silicon and germanium. Any of the above gate insulators or the semiconductor substrates can be used in the embodiment of the present invention; however in order to facilitate comprehension of the explanation, the following description takes the example of a MOS (Metal Oxide Semiconductor) configuration transistor with a silicon (Si) substrate with its surfaces of at least two of the (100) crystal plane, the (110) crystal plane and the (111) crystal plane as a semiconductor substrate, and an oxide film as a gate insulator.

Figure 1:
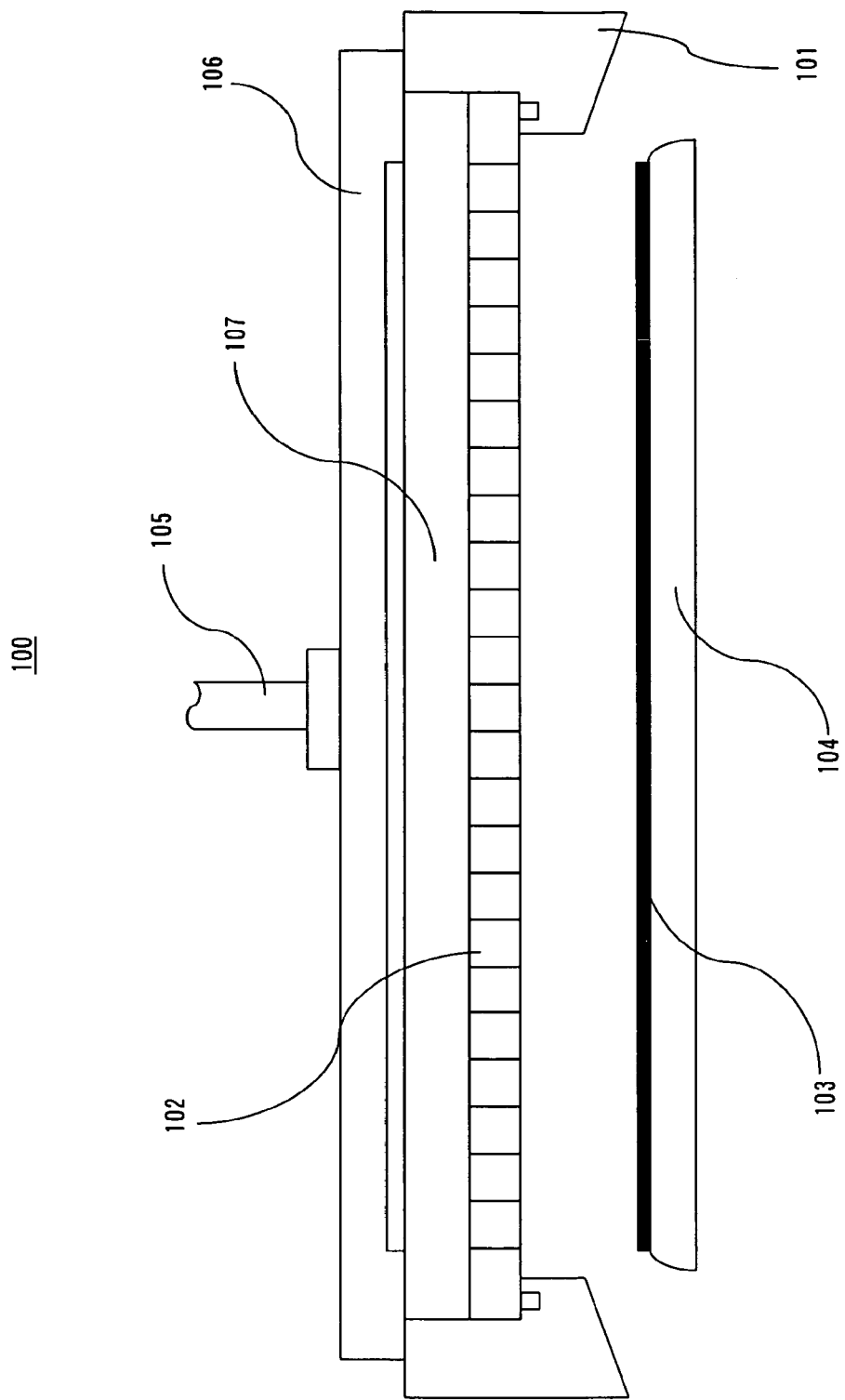
FIG. 1 is a cross-sectional diagram showing an example of a plasma processing device using a radial line slot antenna.

FIG. 1 is a cross-sectional diagram showing an example of a plasma processor device 100 using a radial line slot antenna.

In this gate insulator thin film formation method, in order to remove hydrogen terminating the dangling bonds of the silicon surface, surface terminating hydrogen removal processing and oxidation processing are carried out sequentially in the same processing chamber using Kr as a plasma excitation gas in the subsequent oxide film formation process.

First, a vacuum vessel (processing chamber) 101 is evacuated, argon (Ar) gas is introduced into the vessel from a shower plate 102, and later the introduced gas is changed to krypton (Kr) gas. Pressure in the vacuum processing chamber 101 is set around 133 Pa (1 Torr).

Next, a silicon substrate 103 is placed on a sample holder 104 with a heating mechanism and the temperature of the sample is set around 400° C. If the temperature of the silicon substrate 103 falls within the range of 200-550° C., the results described below will be almost the same. The silicon substrate 103 is treated with diluted hydrofluoric acid cleaning in the immediately preceding pretreatment processing step, and as a result, the dangling bonds of silicon on the surface are terminated with hydrogen.

Next, 2.45 GHz microwaves are provided from a coaxial waveguide 105 to a radial line slot antenna 106, and microwaves are emitted in the processing chamber 101 from the radial line slot antenna 106 via a dielectric plate 107 configured on a part of the wall of the processing chamber 101. The emitted microwaves excite the Kr gas introduced from the shower plate 102 into the processing chamber 101, and high-density Kr plasma is formed directly below the shower plate 102. If the frequency of the provided microwaves is approximately within the range from 900 MHz to 10 GHz, the results explained below are almost the same.

In the configuration shown in FIG. 1, the distance between the shower plate 102 and the substrate 103 is set at 6 cm in the present embodiment. A shorter distance between the two enables higher speed film formation.

Although the present embodiment shows an example of film formation using a plasma device with a radial line slot antenna, other methods can be used to excite plasma by emitting microwaves within the processing chamber.

By exposing the silicon substrate 103 to the plasma excited by the Kr gas, the surface of the silicon substrate 103 receives low-energy Kr ion irradiation, and the terminating hydrogen on the surface is removed.

FIG. 2 shows a result of analysis of silicon-hydrogen bonding on the silicon substrate surface by an infrared spectrograph, and demonstrates the removal effect of the terminating hydrogen on the silicon surface by the Kr plasma excited by emitting microwaves with a power density of 1.2 W/cm$^2$ under 133 Pa (1 Torr) pressure in the processing chamber 101.

Reference to FIG. 2 discloses that only 1 second of Kr plasma irradiation causes most of the optical absorption in the vicinity of a wave number of 2100 cm$^{-1}$, which is characteristic of the silicon-hydrogen bond, to disappear, and with approximately 30 seconds of irradiation, the optical absorption disappears almost completely. In other words, approximately 30 seconds of Kr plasma irradiation can remove hydrogen terminating the silicon surface. In the present embodiment, Kr plasma irradiation is continued for 1 minute and completely removes the terminating hydrogen on the surface.

Next, a $Kr/O_2$ gas mixture with a partial pressure ratio of 97/3 is introduced from the shower plate 102. In so doing, the pressure in the processing chamber is maintained at around 133 Pa (1 Torr). In high-density excitation plasma in which Kr gas and $O_2$ gas are mixed, Kr*, which is in an intermediate excitation state, and $O_2$ molecules collide, effectively generating a large amount of atomic oxygen O*.

In the present embodiment, the surface of the silicon substrate 103 is oxidized by this atomic oxygen O*. The use of the present thin film formation method enables oxidation processing by the atomic oxygen at the significantly low temperature of around 400° C. In order to increase the chance of Kr*—$O_2$ collisions, it is desirable for the processing chamber to have a high pressure; however, if it is too high, the generated O* collide with one another and become $O_2$ molecules again. Therefore, there is an optimal gas pressure.

FIG. 3 shows the relationship between the thickness of the formed oxide film and the pressure in the processing chamber in a case where, maintaining the pressure ratio of Kr/$O_2$ at 97/3 within the processing chamber, the gas pressure within the processing chamber 101 is changed. In FIG. 4, the temperature of the silicon substrate 103 is set at 400° C., and the oxidation processing is carried out for 10 minutes.

Reference to FIG. 3 reveals that the oxidation rate is highest when the pressure within the processing chamber 101 is around 133 Pa (1 Torr), and thus this pressure or pressure conditions around this pressure are optimal. The optimal pressure is not limited to the case that the plane orientation of the silicon substrate 103 is the (100) plane, but is the same for any silicon surface with any plane orientation.

When silicon oxide film of a desired film thickness is formed, application of microwave power is stopped and then the plasma excitation is terminated. Additionally, the Kr/$O_2$ gas mixture is replaced by Ar gas, and then the oxidation process is completed. The Ar gas is used before and after the present process as a purge gas, which is less costly than Kr. The Kr gas used for the present process is to be recovered and recycled.

Following the above Kr/$O_2$ plasma oxide film formation, a semi-conductor integrated circuit device comprising a MOS transistor and a capacitor can be completed after well-known electrode formation process, protective film formation process, and hydrogen sintering processing process etc.

When the hydrogen content in units of surface density within a 3 nm thick silicon oxide film formed by the above procedure was measured by thermal desorption analysis, the results were around $10^{12}$/cm$^2$ or less. It is confirmed that the hydrogen content in units of surface density within the silicon oxide film is around $10^{11}$/cm$^2$ or less in an oxide film with particularly low leakage current. By comparison, the oxide film, which was not exposed to the Kr plasma before the oxide film formation contained hydrogen at over $10^{12}$/cm$^2$ in units of surface density.

Measurement of roughness of a silicon surface after exfoliating the silicon oxide film formed by the above procedure by an atomic force microscope and comparison with that of silicon roughness before oxide film formation confirmed that the roughness of the silicon surface remains unchanged. In other words, the silicon surface does not increase in roughness after removal of terminating hydrogen and oxidation.

According to the present gate insulator thin film formation method, hydrogen, remaining at the interface between a silicon substrate and a silicon oxide film formed as the gate insulator of a MOS transistor, is removed, and the interface is flattened. By such flattening, a low Dit at midgap at the interface can be attained and favorable electrical characteristics (low leakage current characteristics, low Dit at midgap, high voltage resistance, high hot carrier resistance, constant threshold voltage characteristics etc.) can be acquired even though the gate insulator is thinned. Additionally, in the case of a gate insulator with an arbitrary plane orientation, favorable electrical characteristics can still be acquired from the plane orientation.

In order to indicate the effectiveness of a MOS transistor having a 3-dimensional configuration, described later, as an example of an embodiment of the present invention, an example of analysis results of the above different plane orientation (crystal plane) is explained below.

FIG. 4 shows the growth rate of a Kr/$O_2$ plasma oxide film, when oxidizing the (100) plane, the (111) plane and the (110) plane of a silicon substrate with the plasma processing device 100 of FIG. 1, in comparison with growth rates of dry thermal oxide films.

Reference to FIG. 4 shows that the Kr/$O_2$ plasma oxide film yields a much higher growth rate than the dry thermal oxide film, oxidation of an Si substrate using active atomic oxygen O* proceeds efficiently. In addition, it is understood from FIG. 4 that for the (111) plane and the (110) plane, of which the Si atom surface density is greater than the (100) plane, lower growth rate is yield than for the (100) plane. This is in agreement with the conclusion derived from the material supply rate determining process; therefore the result suggests that the plasma oxide film formed in such a manner has a superior film quality.

Conversely, when forming dry thermal oxide films on the (111) and the (110) planes of Si substrate, the growth rate of the oxide film is higher than the growth rate when forming a dry thermal oxide film on the (100) plane, suggesting that the film quality of the dry thermal oxide film formed on the (111) plane and the (110) plane are inferior.

FIG. 5 shows a comparison result of Dit at midgap of the Kr/$O_2$ plasma oxide film formed as above and that of the dry thermal oxide film.

Reference to FIG. 5 discloses that the Dit at midgap of the Kr/$O_2$ plasma oxide film formed on the (100) plane of a silicon and the Kr/$O_2$ plasma oxide film formed on the (111) plane of a silicon and the (110) plane of a silicon are all lower than those of the dry thermal oxide film formed on the (100) plane of a silicon, and an oxide film with extremely high quality can be acquired.

Conversely, a dry thermal oxide film formed on the (111) plane of a silicon and the (110) plane of a silicon has an extremely high Dit at midgap as predicted from the result in FIG. 4, and it is possible that various problems may be caused such as change in threshold voltage by carrier capture and increase in gate leakage current when used as a gate insulator of an MOS transistor.

In such a manner, by applying the gate insulator thin film formation technique to formation means of a gate insulator of an MOS transistor, the effectiveness of formation of a gate insulator not only on the (100) plane of a silicon substrate but also on the (110) plane of a silicon substrate and the (111) plane of a silicon substrate is indicated in the embodiment of the present invention.

Figure 6:
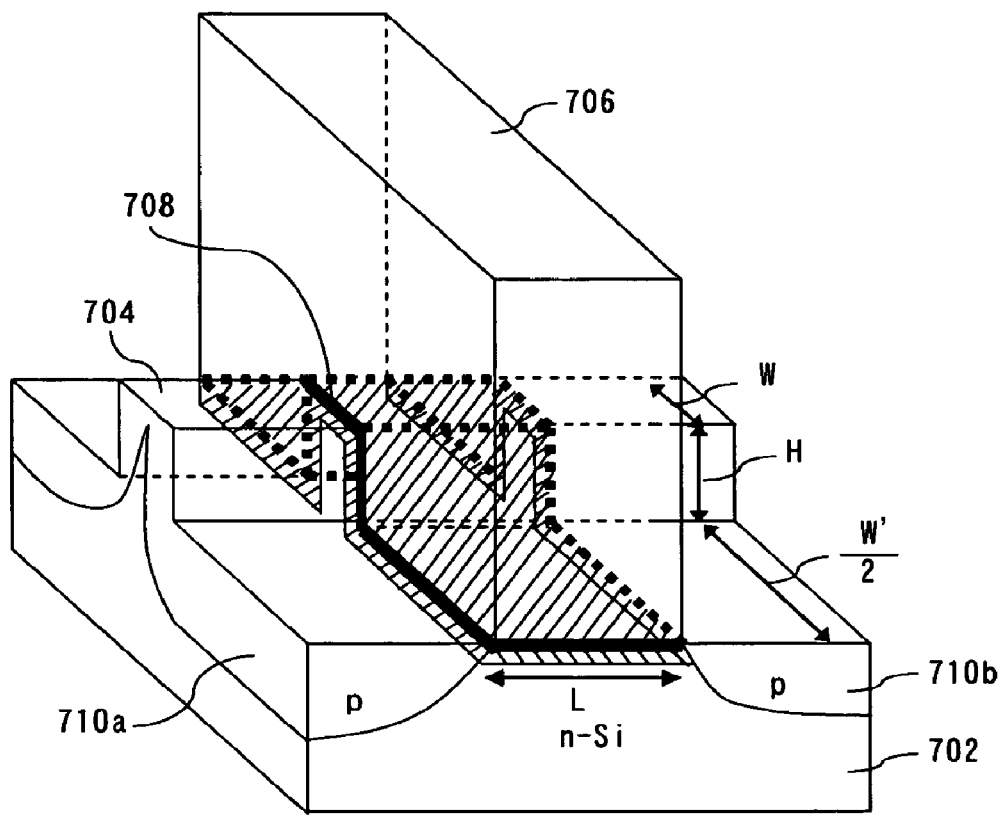
FIG. 6 is an example of a configuration of a p-channel MOS transistor.
Figure 7:
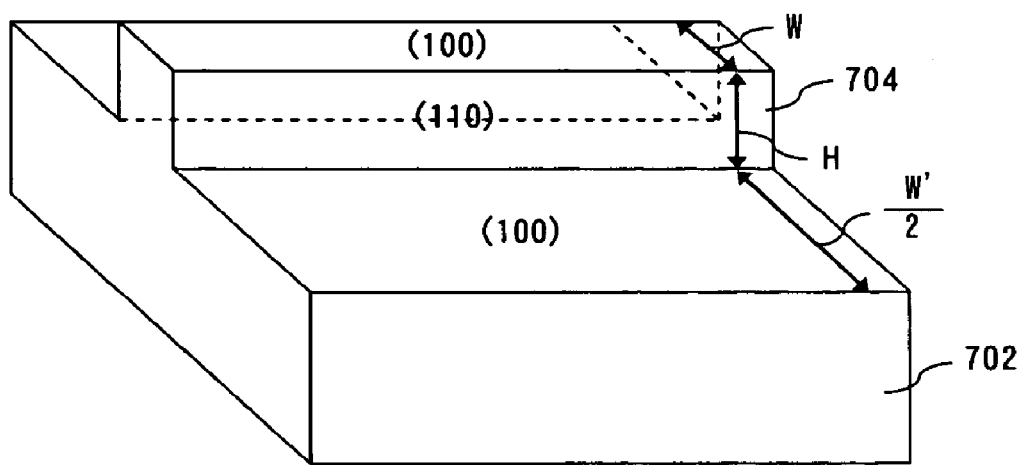
FIG. 7 is a diagram of a part extracted from FIG. 6.

In the following description, details of a configuration of a MIS transistor of an embodiment of the present invention, supported by the effect explained above, are set forth. FIG. 6 and FIG. 7 are examples of configurations of a 3-dimensional p-channel MOS transistor.

FIG. 7 is a diagram of a part extracted from FIG. 6.

A p-channel MOS transistor 700, shown in FIG. 6 as an example, is formed on a Si substrate 702 with a principal plane of the (100) plane on which the p-type region is formed as shown in FIG. 7.

As shown FIG. 7, a projecting part 704 with a width W and a height H is formed in the p-type region of the Si substrate 702. As in FIG. 7, the top plane of the projecting part 704 is defined by the (100) plane, and the both sidewall planes are defined by the (110) planes.

A silicon oxide film is evenly formed on the Si substrate 702 of FIG. 6 by the plasma processing device 100 explained in FIG. 1, and on top of the film, a polysilicon gate electrode 706 shown in FIG. 6 is formed on the p-type region of the Si substrate 702. In addition, the patterning of the silicon oxide film is performed following the patterning of the gate electrode 706, and a gate insulator 708 is formed in a region surrounded by a bold line and broken line shown in FIG. 6 so as to fit the gate electrode 706.

Further, in the p-channel MOS transistor 700 of FIG. 6, p-type diffusion regions 710a and 710b including the above projecting part 704 are formed on both sides of the gate electrode 706 as shown in FIG. 6 by ion implantation of a p-type impurity by using the gate electrode 706 as a self-aligning mask. As a result, the p-channel MOS transistor 700 is formed on the above p-type region on the Si substrate 702.

The p-channel MOS transistor 700, described in the present example, has a gate length of L, and the gate electrode 706 covers flat parts of the Si substrate 702 for a gate width of W'/2 on both sides of the projecting part 704. Consequently the gate width on the (100) plane of the gate electrode 706 including the top part of the projecting part 704A is expressed by W+W'. Meanwhile, the gate width on the (110) plane of the gate electrode 706 is formed on both sidewalls, and thus is expressed by 2H.

When voltage is applied to such a p-channel MOS transistor of the above configuration, channels, in which holes move, are generated in the Si substrate 702 along the gate insulator 708 as indicated by shaded area.

According to the above configuration, the current driving capacity of the p-channel MOS transistor 700 formed on the p-type region is expressed by an equation $\mu_{p1}(W+W')+2\mu_{p2}H$, where $\mu_{p1}$ represents the hole mobility in the (100) plane and $\mu_{p2}$ represents the hole mobility in the (110) plane.

The configuration of the p-channel MOS transistor shown in this example has a convex configuration with two sidewalls in order to configure a crystal plane other than the (100) plane, which is the principal plane; however a configuration may comprise only one sidewall.

It is possible to make the element area sufficiently small by configuring the gate width so that the W' is adequately smaller than the H. In such a case, the channel width depends on the length of H and W alone.

In the p-channel MOS transistor configured as above, low Dit at midgap is achieved and the flicker noise can be reduced in each of the interfaces between the semiconductor substrate with different plane orientations and the gate insulator. Additionally, by assuming a channel configuration shown by shaded area in FIG. 6, it is possible to reduce the channel length modulation effect, and therefore favorable electrical characteristics can be stably acquired. The MOS transistor with such convex configuration is a stable element reducing variation in the electrical characteristics in each element.

Moreover, in such a p-channel MOS transistor with 3-dimensional configuration, the gate width of the p-channel MOS transistor can be acquired not only on the principal plane of the semiconductor substrate (the (100) plane, for example) but also on a crystal plane oriented in different directions as described above (the (110) plane, for example). Additionally, it is possible that the gate width can be acquired from the projecting part itself alone without using the principal plane. Thus, the channels generated between the p-type diffusion regions 710a and 710b along the gate insulator are generated on crystal planes other than the principal plane.

As explained above, because the electrical characteristics of the channel are favorable for any crystal plane (in other words, reduction in the energy amount effective for driving a transistor per unit length of the channel width is controlled), it is possible to make the element area of the p-channel MOS transistor small in practice by choosing a large value for H instead of for the value of W+W', and gaining channel width in the vertical direction in FIG. 6.

In the above configuration example, the (100) plane of the Si substrate is the principal plane and the (110) plane of the Si substrate is the sidewall plane; however, a transistor may be configured by arbitrarily combining the (100) plane, the (110) plane and the (111) plane, and an effect similar to the above should be acquired from any combination.

In the above configuration example, the p-channel MOS transistor is set forth; however, the n-channel MOS transistor can also comprise both the 3-dimensional configuration and the effect similar to the above.

Next, a configuration of a CMOS (Complementary Metal Oxide Semiconductor) transistor, in which the 3-dimensional configuration of the MOS transistor is applied only to a p-channel MOS transistor with small mobility, is described.

Figure 8:
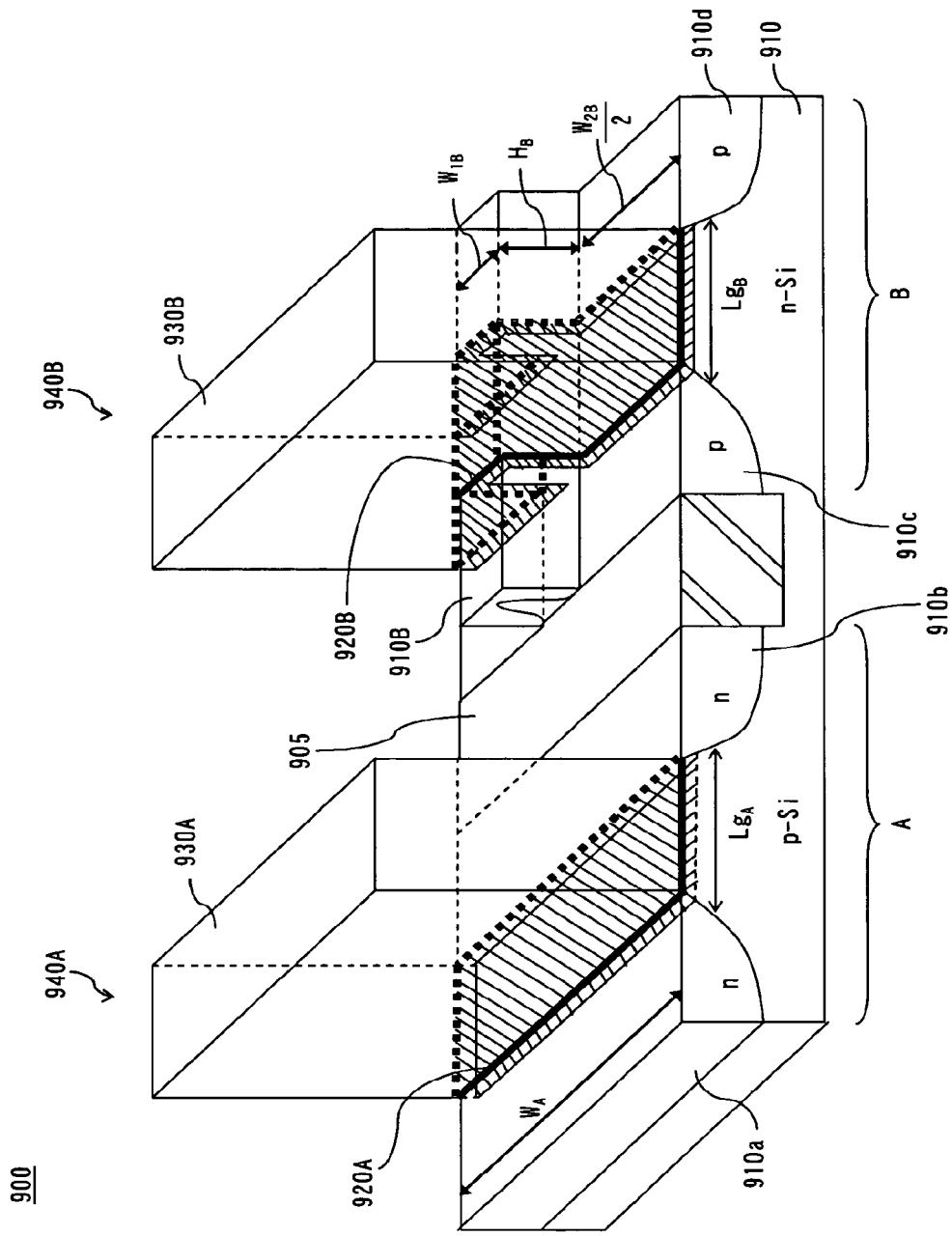
FIG. 8 is an example of a configuration of a CMOS transistor.
Figure 9:
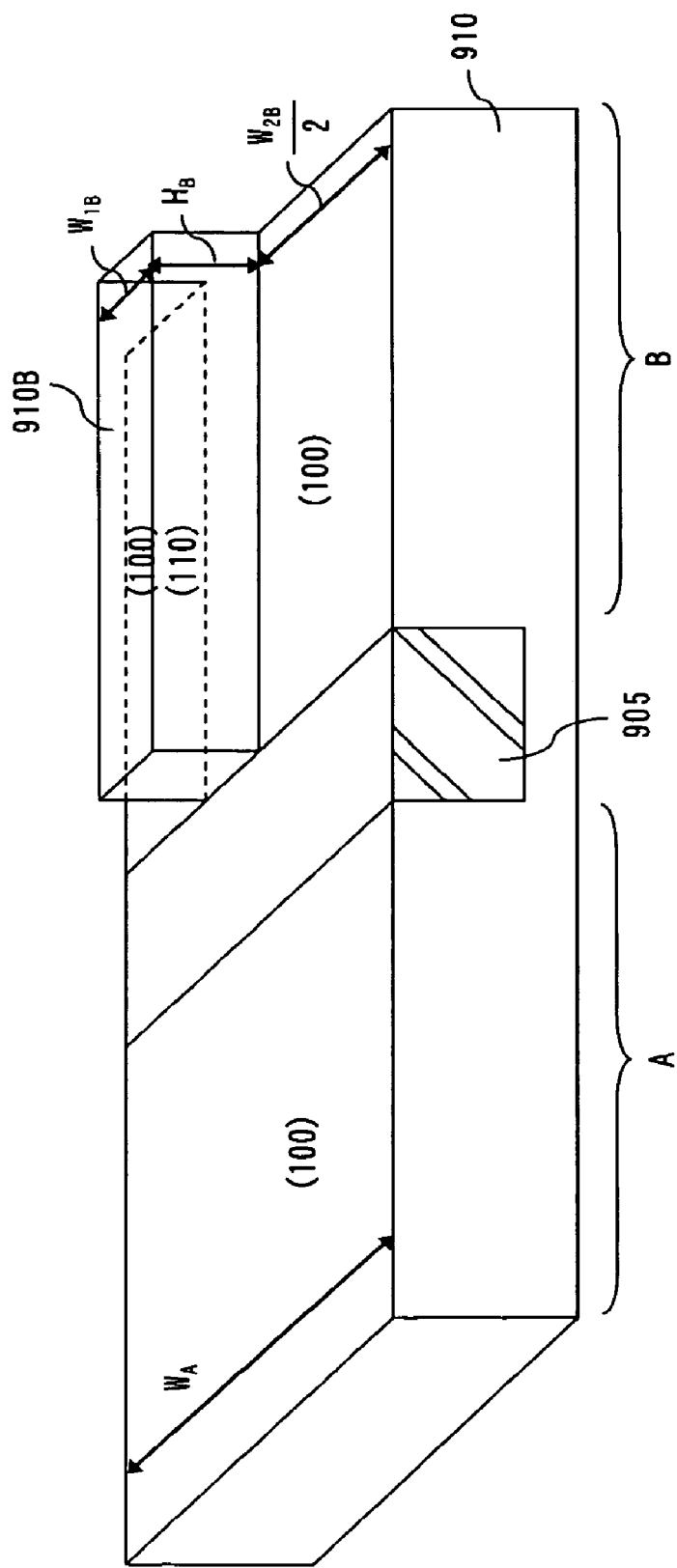
FIG. 9 is a diagram of a part extracted from FIG. 8.

FIG. 8 and FIG. 9 are configuration examples of a CMOS transistor comprising a p-channel MOS transistor and an n-channel MOS transistor.

FIG. 9 is a diagram of a part extracted from FIG. 8.

A CMOS transistor 900 in FIG. 8 is formed on a Si substrate 910 with a principal plane of the (100) plane on which an n-type region A and a p-type region B, separated by an element separation region 905, are formed as shown in FIG. 9, and a projecting part 910B with its width of $W_{1B}$ and both sidewalls height of $H_B$ are formed on the p-type region B. As is clear from FIG. 9, the top plane of the projecting part 910B is defined by the (100) plane, and the sidewall plane is defined by the (110) plane.

A silicon oxide film is evenly formed on the Si substrate 910 of FIG. 9 by the plasma processing device 100 explained in FIG. 1, and over the film, polysilicon gate electrodes 930A and 930B shown in FIG. 8 are formed on the region A and the region B, respectively. In addition, the patterning of the silicon oxide film is performed as the patterning of the gate electrodes 930A and 930B, and a gate insulator 920A is formed so as to correspond to the gate electrode 930A and a gate insulator 920B is formed so as to correspond to the gate electrode 930B in a plane surrounded by bold lines and broken lines shown in FIG. 8.

Further, in the CMOS transistor 900 in FIG. 8, n-type diffusion regions 910a and 910b are formed on both sides of the gate electrode 930A in the n-type region A by ion implantation of an n-type impurity using the gate electrode 930A as a self-aligning mask. In the p-type region B, the p-type diffusion regions 910c and 910d including the projecting part 910B are formed in the regions both sides of the gate electrode 930B. As a result, the n-channel MOS transistor 940A is formed on the above n-type region A and the p-channel MOS transistor 940B is formed on the above p-type region B on the Si substrate 910.

In the CMOS transistor 900 shown in this example, the n-channel MOS transistor 940A has a gate length of $L_{gA}$, and the p-channel MOS transistor 940B has a gate length of $L_{gB}$.

In the n-channel MOS transistor shown in this example, the gate electrode 930A covers the (100) plane of the Si substrate 910 with a width of $W_A$ as shown in FIG. 8. Consequently, the gate width of the n-channel MOS transistor is expressed by $W_A$.

On the other hand, in the p-channel MOS transistor, the gate electrode 930B covers the flat part of the Si substrate 910 with a gate width of $W_{2B}/2$ on each side of the projecting part 910B. As a result, in the p-channel MOS transistor, the gate width on the (100) plane of the gate electrode 930B including the top part of the projecting part 910B is represented by $W_{1B}+W_{2B}$, and the gate width on the (110) plane of the gate electrode 930B is formed on both sidewalls and thus is represented by $2H_B$.

When voltage is applied to such a CMOS transistor with the above configuration, in the n-type region A, a channel, in which electrons move, is generated in the Si substrate 910 along the gate insulator 920A, and in the p-type region B, a channel, in which holes move, is generated in the Si substrate 910 along the gate insulator 920B as indicated by shaded area in FIG. 8.

According to the above configuration, the current driving capacity of the n-channel MOS transistor 940A formed on the n-type region A is expressed by an equation $\mu_{n1}W_A$, where $\mu_{n1}$ represents the electron mobility of the (100) plane.

On the other hand, the current driving capacity of the p-channel MOS transistor 940B formed on the p-type region B is expressed by an equation $\mu_{p1}(W_{1B}+W_{2B})+2\mu_{p2}H_B$, where $\mu_{p1}$ represents hole mobility in the (100) plane and $\mu_{p2}$ represents hole mobility in the (110) plane.

Then, in the 3-dimensional CMOS transistor 900 shown in this example, by setting the width and the height of the projecting part 910B of the p-channel MOS transistor 940B so as to satisfy the equation $\mu_{n1}W_A=\mu_{p1}(W_{1B}+W_{2B})+2\mu_{p2}H_B$, the current driving capacity of the n-channel MOS transistor 940A can be set equal to the current driving capacity of the p-channel MOS transistor 940B.

Particularly in such a configuration, by setting the height $H_B$ of the projecting part 910B so as to satisfy the above equation with the conditions that $W_A=W_{1B}+W_{2B}$, and $L_{gA}=L_{gB}$, element areas of the n-channel MOS transistor 940A can be the same as those of the p-channel MOS transistor 940B, and both of the current driving capacities can be equal to each other.

The configuration of the p-channel MOS transistor shown in this example has a convex configuration with two sidewalls in order to configure a crystal plane other than the (100) plane, which is the principal plane; however a configuration may comprise only one sidewall.

In the CMOS transistor configured as above, low Dit at midgap is achieved in the interface between semiconductor substrate and the gate insulator, therefore the flicker noise can be reduced, and favorable electrical characteristics can be stably acquired. For this reason, a CMOS transistor with such a configuration is a stable element with variation in the electrical characteristics of the element reduced. Specifically, because the current driving capacity of the n-channel MOS transistor and that of the p-channel MOS transistor can be matched, reduction in driving capacity etc. caused by the variation of the electrical characteristics of each MOS transistor can be suppressed.

In the CMOS transistor with a 3-dimensional p-channel MOS transistor, furthermore, the gate width of the p-channel MOS transistor can be acquired not only on the principal plane of the Si substrate (the (100) plane, for example), but also on a crystal plane of the projecting part formed on the principal plane (the (110) plane, for example) and oriented in a different direction. Therefore, the channels generated between the p-type diffusion regions 910c and 910d, along the gate insulator are generated not only on the principal plane of the semiconductor substrate but also on the other crystal plane. Because the electrical characteristics in the above channels are favorable to any crystal plane as described above (in other words, reduction in the amount of energy effective for driving a transistor per unit length of the channel width is controlled), it is possible to make the element area of the p-channel MOS transistor small according to the element area of the n-channel MOS transistor by using a large value of $H_B$ instead of the value of $W_{1B}+W_{2B}$, and gaining channel width in the vertical direction in FIG. 8.

In the above configuration example, the (100) plane of the Si substrate is the principal plane and the (110) plane of the Si substrate is the sidewall plane; however, a transistor may be configured by arbitrarily combining the (100) plane, the (110) plane and the (111) plane, and an effect similar to the above should be acquired from any combination.

Figure 10B:
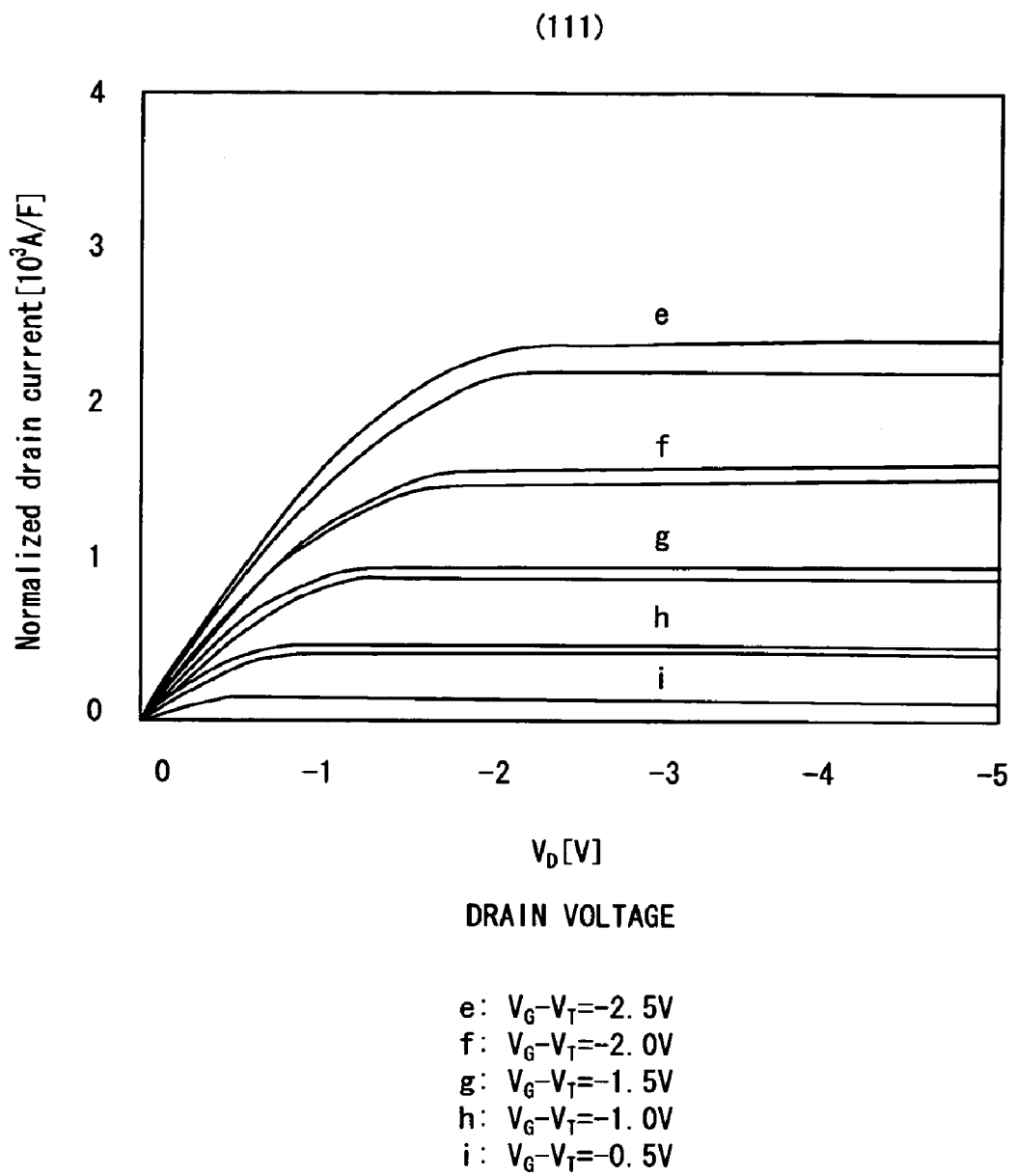
FIG. 10B shows drain voltage versus normalized drain current characteristic.
Figure 10C:
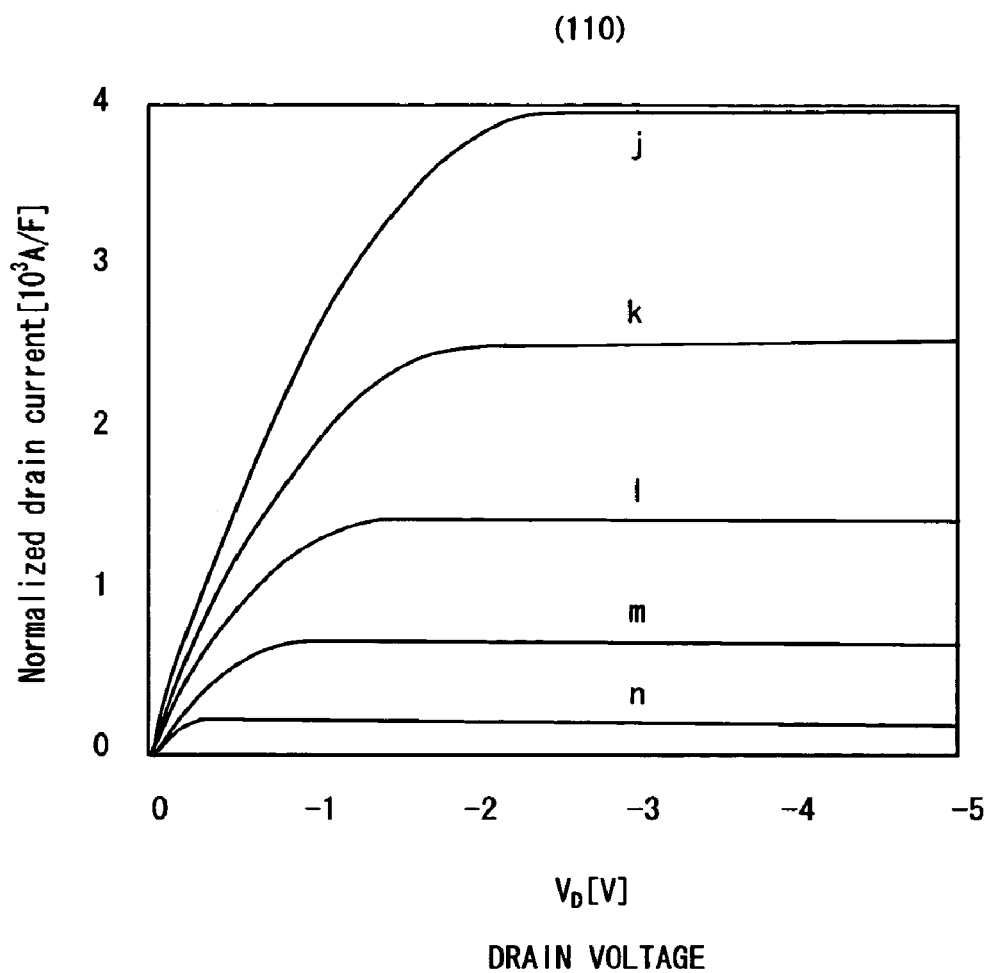
FIG. 10C shows drain voltage versus normalized drain current characteristic.

FIG. 10A-FIG. 10C show the relationship between the drain voltage and the normalized drain current when a silicon oxide film is formed on the (100) plane of a silicon substrate, the (111) plane of a silicon substrate and the (110) plane of a silicon substrate, respectively, by the plasma processing device 100 in FIG. 1 and a p-channel MOS transistor with the silicon oxide film as a gate insulator is formed. FIG. 10A and FIG. 10B show both of the cases that the silicon oxide film is formed by the $Kr/O_2$ plasma processing and that the silicon oxide film is formed by dry thermal oxidation processing. In FIG. 10C, however, because an oxide film is not formed on the (110) plane of a silicon by dry thermal oxidation processing, only an example of a gate oxide film formed by $Kr/O_2$ plasma processing is shown. The result of FIG. 10A is of a p-channel MOS transistor with a gate length of 10 μm and a gate width of 50 μm, and the results in FIG. 10B and FIG. 10C are of the p-channel MOS transistor with a gate length 10 μm and a gate width of 300 μm.

Reference to FIG. 10A-FIG. 10C describes that it is possible to increase the drain current of the p-channel MOS transistor, that is mutual conductance or current driving capacity, by forming a transistor on any crystal surface except for the (100) plane of a silicon, such as the (111) plane or the (110) plane, to acquire a current driving force of about 1.3 times as much as that of the p-channel MOS transistor formed on the (100) plane when the p-channel MOS transistor is formed on the (111) plane of a silicon, and to acquire a current driving force of about 1.8 times as much as that of the p-channel MOS transistor formed on the (100) plane when the p-channel MOS transistor is formed on the (110) plane of a silicon.

As the above data indicates, it is demonstrated that the MOS transistor configured in 3-dimensions using crystal planes oriented in different plane directions in FIG. 6 and FIG. 8 has a high current driving capacity.

The above 3-dimensional MIS transistor and CMOS transistor can be applied to various circuits.

For example, the CMOS transistor of the embodiment of the present invention can be applied to a pass-transistor circuit, inverter circuit, a push-pull amplifier and so on. In such a case, it is possible to align the switching characteristics etc. of the p-channel MOS transistor and of the n-channel MOS transistor comprised in the CMOS transistor, and therefore output signal distortion output by the transistor can be substantially reduced.

Application to a NAND circuit and a NOR circuit of a digital circuit, for example, is also possible.

In addition, only the n-channel MOS transistor or the p-channel MOS transistor without using the CMOS transistor can be applied to the above circuits.

It is obvious that the MIS transistor or the CMOS transistor of the embodiment of the present invention can be applied to analog circuits.

As described above, according to the embodiment of the present invention, channel width can be acquired on a crystal plane formed by projection from a prescribed crystal plane, which determines the element area. In the channels generated along each crystal plane, reduction of the amount of energy effective for driving a transistor in unit length of the channel width can be substantially controlled. For that reason, acquisition of further channel width is practically possible while controlling increase in element area.

It is also possible to reduce the size of the CMOS transistor as the element area of the p-channel MOS transistor, which directly causes the element area of a CMOS transistor to be large, can be small.

Furthermore, in the case that the element area of the p-channel MOS transistor is close to or equal to that of the n-channel MOS transistor, because the channels are generated in a direction different from a direction, which enlarges the element area of the p-channel MOS transistor, both of the current driving capacities can be matched without causing variation in their element areas.

The present invention is to be construed as embodying many variations without departing from the scope and spirit thereof. Accordingly, it is to be understood that descriptions herein are proffered by way of example to facilitate comprehension of the invention and should not be construed to limit the scope. The scope of the present invention is presented by the scope of claims and should not be limited by the descriptions. In addition, all modifications and alternative constructions, which fall into the equivalents of the scope of the claims, fairly fall within the scope of the present invention.

The invention claimed is:

1. A CMOS device having an n-channel MOS transistor and a p-channel MOS transistor formed in a semiconductor substrate having a surface with a principal crystal plane,
  wherein said n-channel MOS transistor comprises
    a first gate insulator film formed on a flat portion of said surface of said semiconductor substrate having an electron mobility, $\mu_{n1}$,
    a first gate electrode formed on said first gate insulator film so as to be elongated in the direction of a gate length, $L_A$, and in the direction of a gate width, $W_A$, and
    a pair of n-type regions formed in said semiconductor substrate on both sides of said first gate electrode in the direction of said gate length,
  wherein said p-channel MOS transistor comprises
    a projecting part formed on said semiconductor substrate and directly projecting from the surface of said semiconductor substrate, at least one of a top surface of width $W_{1B}$ having a hole mobility $\mu_{p1}$, and a side wall of said projecting part of height $H_B$, having a secondary crystal plane different from said principal crystal plane and having a hole mobility $\mu_{p2}$, a top plane of said projecting part is the (100) crystal plane and a side wall plane of said projecting part is the (110) crystal plane,
    a second gate insulator film formed on said semiconductor substrate including said projecting part in such a way that said second gate insulator film covers at least a portion of said semiconductor substrate of width $W_{2B}$, said top surface and said side wall of said projecting part,
    a second gate electrode formed on said second gate insulator film so as to be elongated in the direction of a gate length, $L_B$, and in the direction of a gate width, $W_B$,
    a pair of p-type regions formed in said semiconductor substrate including said projecting part on both sides of said second gate electrode in the direction of said gate length; and
  wherein said semiconductor substrate is a silicon substrate, and said principal crystal plane is the (100) crystal plane, and said secondary crystal plane is the (110) crystal plane; wherein for $W_A=W_{1B}+W_{2B}$ and $L_A=L_B$, $H_B$ is effectively set such that $\mu_{n1} W_A = \mu_{p1}(W_{1B}+W_{2B}) + 2\mu_{p2}H_B$.

* * * * *